United States Patent
Omura et al.

(10) Patent No.: US 10,026,622 B2
(45) Date of Patent: Jul. 17, 2018

(54) METHOD FOR MANUFACTURING SEMICONDUCTOR DEVICE

(71) Applicant: TOSHIBA MEMORY CORPORATION, Tokyo (JP)

(72) Inventors: Mitsuhiro Omura, Kuwana Mie (JP); Tsubasa Imamura, Kuwana Mie (JP); Itsuko Sakai, Kuwana Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/253,827

(22) Filed: Aug. 31, 2016

(65) Prior Publication Data
US 2017/0271170 A1 Sep. 21, 2017

(30) Foreign Application Priority Data
Mar. 16, 2016 (JP) .................. 2016-052770

(51) Int. Cl.
*H01L 21/311* (2006.01)
*H01L 27/115* (2017.01)
*H01L 21/67* (2006.01)
*H01L 21/3213* (2006.01)

(52) U.S. Cl.
CPC .. *H01L 21/31144* (2013.01); *H01L 21/31116* (2013.01); *H01L 21/32136* (2013.01); *H01L 21/32137* (2013.01); *H01L 21/67069* (2013.01); *H01L 27/115* (2013.01)

(58) Field of Classification Search
None
See application file for complete search history.

(56) References Cited

U.S. PATENT DOCUMENTS

| 2005/0059212 A1* | 3/2005 | Kitamura ......... H01L 27/11521 438/257 |
| 2005/0189600 A1* | 9/2005 | Ohuchi ............ H01L 29/6656 257/412 |
| 2015/0303069 A1 | 10/2015 | Narishige et al. |

FOREIGN PATENT DOCUMENTS

| JP | 4360065 | 11/2009 |
| JP | 4416595 | 2/2010 |
| JP | 2014-017406 | 1/2014 |

OTHER PUBLICATIONS

H. Takana, et al., "Bit Cost Scalable Technology with Punch and Plug Process for Ultra High Density Flash Memory." 2007 Symposium on VLSI Technology Digest of Technical Papers, 2007, pp. 14-15.

* cited by examiner

*Primary Examiner* — Jiong-Ping Lu
(74) *Attorney, Agent, or Firm* — Patterson & Sheridan, LLP

(57) ABSTRACT

According to one embodiment, a method for manufacturing a semiconductor device includes forming a hole extending in a first direction in a workpiece. The method includes forming a first film on an upper surface of the workpiece and an upper portion of a side wall of the hole. The method includes forming a second film on the first film. The method includes removing portions of the first and second films from the upper surface of the workpiece so that at least a part of the first and second films formed on the upper portion remain. The method includes removing at least a part of a portion of the workpiece which is exposed through the hole using a second etchant. An etching rate of the first etchant for the first film is higher than an etching rate of the first etchant for the second film.

21 Claims, 15 Drawing Sheets

METHOD FOR MANUFACTURING SEMICONDUCTOR DEVICE

CROSS-REFERENCE TO RELATED APPLICATION

This application is based upon and claims the benefit of priority from Japanese Patent Application No. 2016-052770, filed Mar. 16, 2016, the entire contents of which are incorporated herein by reference.

FIELD

Embodiments described herein relate generally to a method for manufacturing a semiconductor device.

BACKGROUND

A semiconductor device which has an integrated memory cell in three dimensions is known in the art. In the process of manufacturing such a semiconductor device, a hole having a high aspect ratio is formed. It is desirable that such a hole has a uniform high aspect ratio.

DETAILED DESCRIPTION

Figure 1:
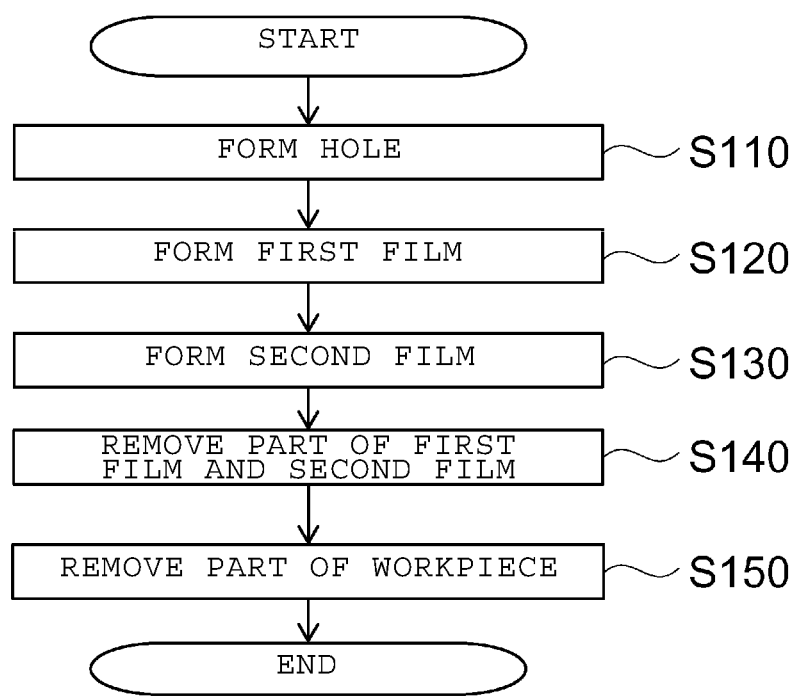
FIG. 1 is a flowchart illustrating an example of a method for manufacturing a semiconductor device according to a first embodiment.

Embodiments provide a method for manufacturing a semiconductor device, by which a hole of a uniformly high aspect ratio can be formed.

In general, according to one embodiment, a method includes forming a hole extending in a first direction in a workpiece, the workpiece including a first layer of a first material, a second layer of a second material stacked on the first layer in the first direction, a third layer of the first material stacked on the second layer in the first direction, and a fourth layer of the second material stacked on the third layer in the first direction; forming a first film on an upper surface of the workpiece and an upper portion of a side wall of the hole; forming a second film on a surface of the first film; selectively removing the first film and the second film from the upper surface of the workpiece using a first etchant so that at least a part of the first film formed on the upper portion and at least a part of the second film formed on the surface of the first film remain; and removing at least a part of a portion of the workpiece which is exposed through the hole using a second etchant, wherein an etching rate of the first film by the first etchant is higher than an etching rate of the second film by the first etchant.

Hereinafter, embodiments will be described with reference to the accompanying drawings.

The drawings are schematic or conceptual, and a relationship between a thickness and a width of each portion or a ratio of the size between portions may be different from an actual value. The same portions may be illustrated in the drawings with different dimensions or ratios. Moreover, in the specification and the respective drawings, the same signs are attached to the same components as those previously described with reference to the previous drawings, and the description thereof will be omitted.

First Embodiment

Hereinafter, an overview of a method for manufacturing according to embodiments will be described.

FIG. 1 is a flowchart illustrating an example of a method for manufacturing a semiconductor device according to an embodiment.

As illustrated in FIG. 1, a hole is formed in a workpiece (step S110), and a first film and a second film are formed on the workpiece and a shallow portion of a side wall of the hole (i.e. near the surface of the workpiece wherein the hole is formed; steps S120 and S130). In addition, the first film formed on the workpiece and the second film formed on the surface of the first film are partially removed using a first etchant (step S140). Portions of the first film and the second film formed on the shallow portion of the side wall of the hole remain. Thereafter, the workpiece which is exposed from the first film and the second film remaining inside the hole is additionally removed by using a second etchant (step S150). That is, while the shallow portion of the hole is protected by using the remaining first and second films, the width of the deep portion of the hole is enlarged by additionally removing material from the workpiece in the deep portion of the hole.

In an embodiment, an etching rate of the first etchant for the first film is higher than an etching rate of the first etchant for the second film. Accordingly, in step S140, the first film and the second film formed on the workpiece can be effectively removed by, for example, a lift-off effect. In the meantime, these films are easy to remain on the shallow portion of the side wall of the hole. While the side wall of the shallow portion of the hole is protected by using these remaining films, the bottom of the hole is enlarged. Accordingly, the hole which has a diameter of high uniformity and is deep can be formed. Accordingly, the hole which has a uniformly high aspect ratio can be formed.

Hereinafter, an example of an apparatus which is used in the above-described manufacturing method will be described first.

Figure 2:
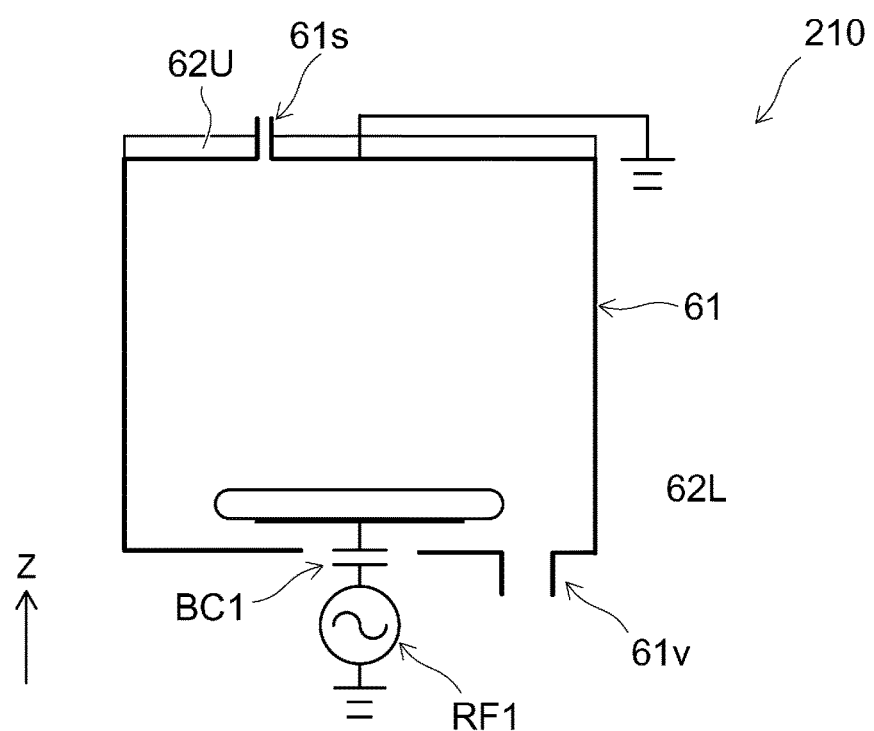
FIG. 2 is a schematic view illustrating an example of a processing apparatus which is used in the method for manufacturing the semiconductor device according to the first embodiment.

FIG. 2 is a schematic view illustrating an example of a processing apparatus which is used in the method for manufacturing the semiconductor device according to the first embodiment.

The processing apparatus 210 is an etching apparatus, for example. The processing apparatus 210 includes a chamber 61, a stage 62L, a first power source RF1, and a first blocking capacitor BC1. The stage 62L is disposed in the chamber 61. The first power source RF1 is a high frequency power source, for example a high frequency RF source. The first power source RF1 is electrically connected with the stage 62L via the first blocking capacitor BC1. For example, the chamber 61 includes a gas supply port 61s, an exit port 61v, and an electrode 62U. For example, at least part of the electrode 62U faces the stage 62L in the Z direction. In this example, the electrode 62U is grounded. In the above-described processing apparatus 210, the workpiece is placed between the stage 62L and the electrode 62U, for example on the stage 62L.

An etching gas is introduced into the chamber 61 from the gas supply port 61s. In addition, power is supplied to the stage 62L from the first power source RF1. Accordingly, plasma is generated. Etching is performed using the plasma. A film may be formed by supplying an appropriate raw material gas to the inside of the chamber 61.

Hereinafter, an example of performing above-described steps S110-S150 using the above-described processing apparatus 210 will be described.

FIGS. 3A to 4G are schematic views illustrating an example of a method for manufacturing a semiconductor device according to an exemplary embodiment.

FIGS. 3A, 3C, 3E, 4A, 4C, 4E, and 4G are cross section views illustrating a processing sequence exemplifying the method for manufacturing the semiconductor device.

FIGS. 3B, 3D, 3F, 4B, 4D, 4F, and 4H illustrate chamber states in the manufacturing processes illustrated in FIGS. 3A, 3C, 3E, 4A, 4C, 4E, and 4G, respectively.

Figure 3A:
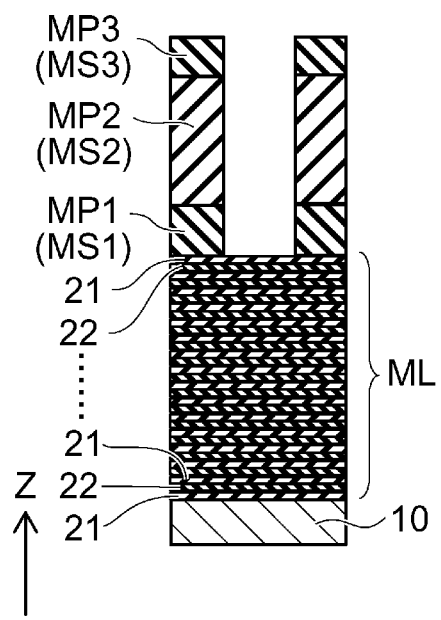
FIGS. 3A to 3F are schematic views illustrating an example of the method for manufacturing the semiconductor device according to the first embodiment.

As illustrated in FIG. 3A, a workpiece ML is formed on a base body 10. A plurality of first layers 21 and a plurality of second layers 22 are alternately stacked in the workpiece ML in a first direction (Z direction). The first layer 21 includes a silicon oxide, for example, and the second layer 22 includes a silicon nitride, for example. The first and second layers are arbitrary layers. In addition, the term "alternately" includes a case that, when the first layer 21 and the second layer 22 are stacked with another film, such as a barrier layer or an adhesive layer, being interposed therebetween, at least one of the first layer 21 and the second layer 22 is a stacked film including a plurality of layers.

A first mask pattern MP1 (for example, a Si film), a second mask pattern MP2 (for example, a C film made by CVD), and a third mask pattern MP3 (for example, a silicon oxide film), which are of predetermined shapes, are formed on the workpiece ML. These patterns are formed as follows.

A first mask film MS1 is formed on the workpiece ML, a second mask film MS2 is formed on the first mask film MS1, and additionally, a third mask film MS3 is formed on the second mask film MS2. A resist film (not illustrated) is formed on the third mask film MS3, and a resist pattern (not illustrated) of a predetermined shape may be obtained by performing exposure and processing in a hole pattern.

Figure 3B:
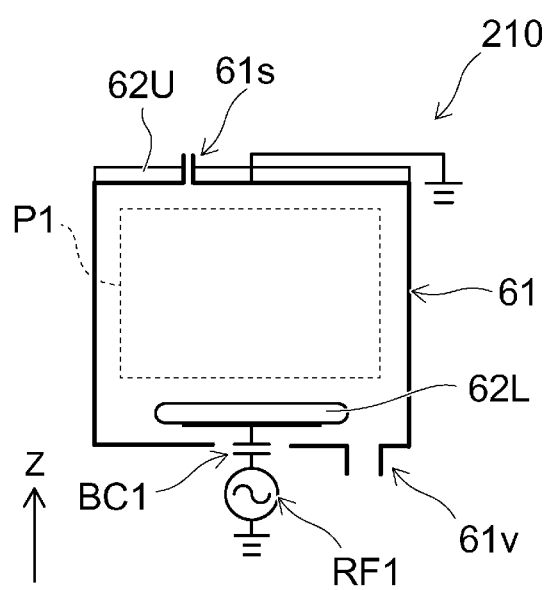

Thereafter, the first mask film MS1, the second mask film MS2, and the third mask film MS3 are processed in the processing apparatus 210 as illustrated in FIG. 3B. For example, an etching gas is introduced into the chamber 61 from the gas supply port 61s, and power is supplied to the stage 62L from the first power source RF1. For example, a fluorocarbon based etching gas of is used as the etching gas. Accordingly, first plasma P1 (for example, fluorocarbon plasma) is generated in the chamber 61. Etching which uses the resist pattern (not illustrated) as a mask is performed by active species included in the first plasma P1. Specifically, the third mask pattern MP3 may be obtained by processing the third mask film MS3. Thereafter, the second mask pattern MP2 may be obtained by processing the second mask film MS2 using the third mask pattern MP3 as a mask. Thereafter, the first mask pattern MP1 may be obtained by processing the first mask film MS1 using the second mask pattern MP2 as a mask. As a result, the first to third mask patterns MP1-MP3 may be obtained from the first to third mask films MS1-MS3, respectively.

For example, the third mask pattern MP3 may be obtained by processing the third mask film MS3 using the resist as a mask and using the fluorocarbon plasma. The second mask pattern MP2 may be obtained by processing the second mask film MS2 using the third mask pattern MP3 as a mask and using plasma including $O_2$ as a main component. The first mask pattern MP1 may be obtained by processing the first mask film MS1 using the second mask pattern MP2 as a mask and using plasma including $Cl_2$ as a main component.

Figure 3C:
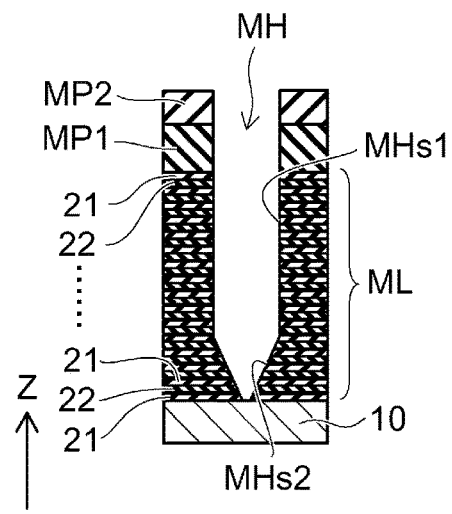

As illustrated in FIG. 3C, a hole MH is formed in the workpiece ML using these masks (step S110). In this process, anisotropic etching using the first to third mask patterns MP1 to MP3 as masks is performed. The hole MH is formed in the workpiece ML by this etching.

The hole MH is formed as follows, for example.

Figure 3D:
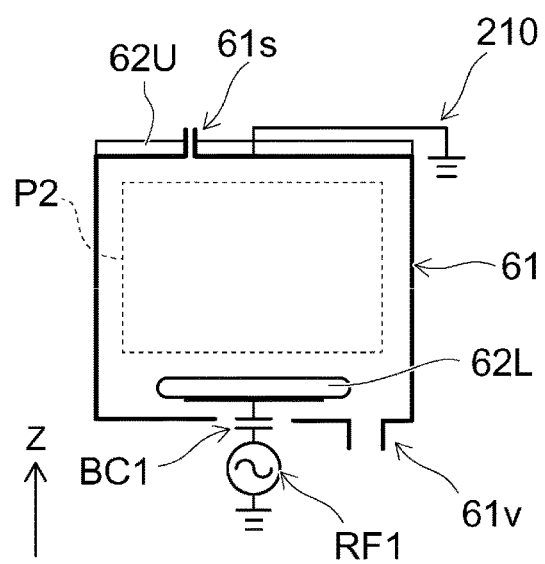

As illustrated in FIG. 3D, an etching gas is introduced into the chamber 61 from the gas supply port 61s, and power is supplied to the stage 62L from the first power source RF1. For example, a fluorocarbon based etching gas is used as the etching gas. Accordingly, second plasma P2 (for example, fluorocarbon plasma) is generated in the chamber 61. The workpiece ML is etched by active species included in the second plasma P2. At this time, the third mask pattern MP3 is removed, and additionally, a part of the second mask pattern MP2 is removed. The other part of the second mask pattern MP2 remains. The hole MH is formed by this etching. The hole MH extends in the Z direction (first direction).

As illustrated in FIG. 3C, the deep portion (lower portion) of the above-described hole MH has a taper shape. For example, an angle between a second side wall MHs2 of the lower portion (deep portion) of the hole MH and the Z direction is greater than an angle between a first side wall MHs1 of the upper portion (shallow portion) of the hole MH and the Z direction.

Figure 3E:
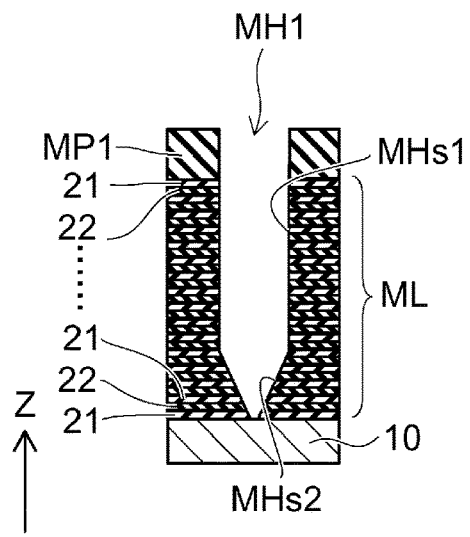

Thereafter, the remaining part of the second mask pattern MP2 is removed as illustrated in FIG. 3E.

Figure 3F:
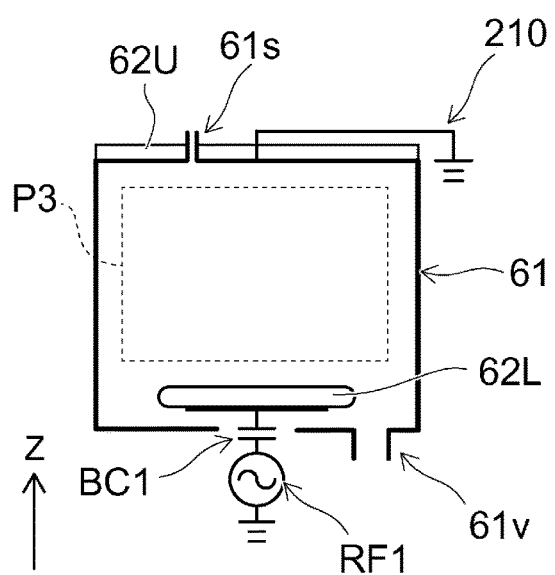

For example, as illustrated in FIG. 3F, an oxygen gas is introduced into the chamber 61. Power is supplied to the stage 62L from the first power source RF1. Accordingly, third plasma P3 (oxygen containing plasma) is generated in the chamber 61. The second mask pattern MP2 is removed by active species included in the third plasma P3.

Figure 4A:
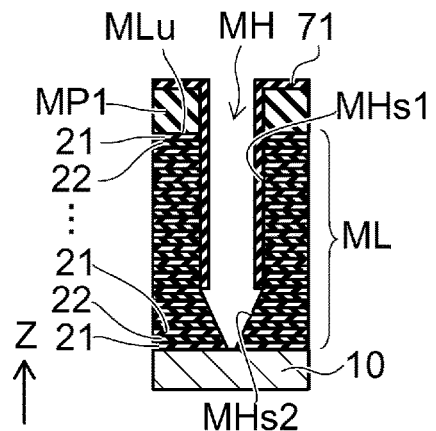
FIGS. 4A to 4H are schematic views illustrating an example of the method for manufacturing the semiconductor device according to the first embodiment.

As illustrated in FIG. 4A, a first film 71 is formed on the workpiece ML and the first side wall MHs1 (shallow portion) of the hole MH (step S120). The first film 71 includes carbon, for example. In this example, the first film 71 is formed on the first mask pattern MP1 formed on an upper surface MLu of the workpiece ML. Additionally, the first film 71 is formed on the first side wall MHs1 (shallow portion) of the hole MH.

The above-described first film 71 is formed as follows.

Figure 4B:
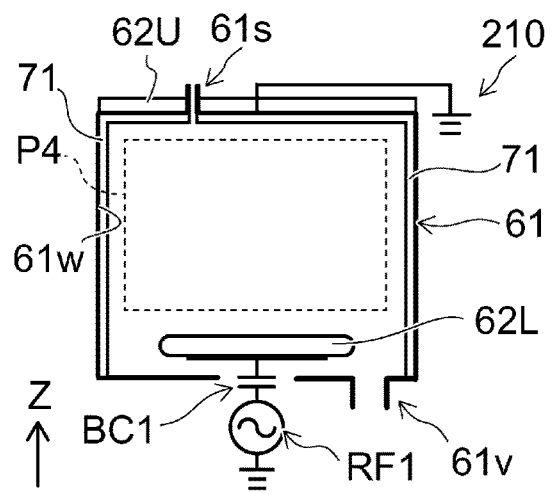

As illustrated in FIG. 4B, a gas including hydrocarbon (for example, methane) is introduced into the chamber 61 from the gas supply port 61s. Power is supplied to the stage 62L from the first power source RF1. Accordingly, fourth plasma P4 (for example, methane plasma) containing carbon is generated in the chamber 61. The first film 71 is formed by active species included in the fourth plasma P4. The active species generated from the hydrocarbon gas have high affinity for the workpiece ML, so the active species are attached to the first side wall MHs1 (shallow portion) of the hole MH prior to reaching the deep portion of the hole MH. Accordingly, the first film 71 is formed on the upper surface MLu of the workpiece ML (on the first mask pattern MP1 in this example), and on the first side wall MHs1 (shallow portion) of the hole MH. The first film 71 includes a carbon film, for example. At this time, a part of the first film 71 is formed on at least part of an inner wall 61w of the chamber 61.

Figure 4C:
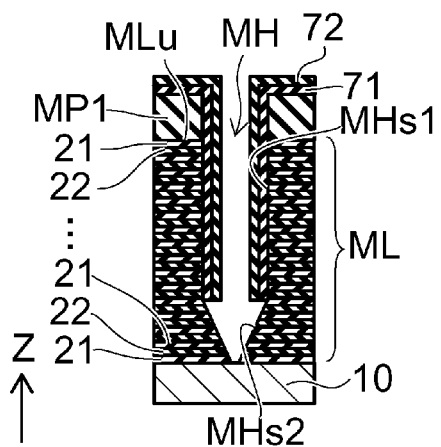

As illustrated in FIG. 4C, a second film 72 is formed on at least part of the surface of the first film 71 (step S130). The second film 72 includes a metallic element. For example, the second film 72 includes a metal oxide film. For example, the second film 72 includes at least one element selected from the group consisting of tungsten, molybdenum, titanium, aluminum, rhenium, iridium, platinum, and ruthenium. For example, the second film 72 includes a tungsten oxide.

For example, the above-described second film 72 is formed as follows.

Figure 4D:
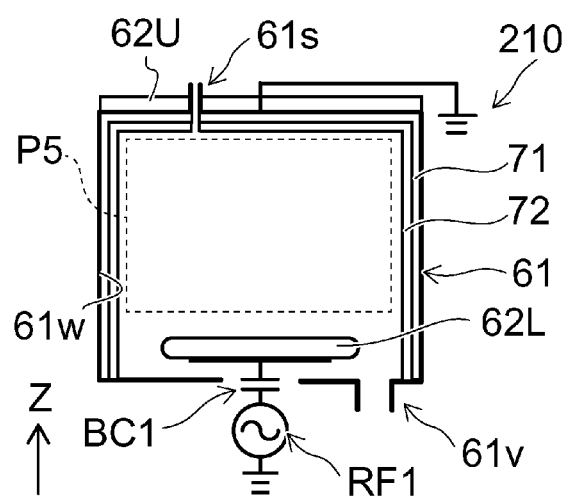

As illustrated in FIG. 4D, a mixture gas of a gas including a metallic element (for example, a tungsten hexafluoride gas) and an oxygen gas is introduced into the chamber 61 from the gas supply port 61s. Power is supplied to the stage 62L from the first power source RF1. Accordingly, fifth plasma P5 (mixture gas plasma) is generated in the chamber 61. The second film 72 is formed by active spices included in the fifth plasma P5. At this time, a part of the second film 72 is formed on at least part of the surface of the first film 71 which is formed on the inner wall 61w of the chamber 61. For example, as the gas including the metallic element, at least one compound selected from the group consisting of $WF_6$ (tungsten hexafluoride), $MoF_6$ (molybdenum hexafluoride), $ReF_6$ (rhenium hexafluoride), $IrF_6$ (iridium hexafluoride), $PtF_6$ (platinum hexafluoride), $TiCl_4$ (titaniumtetrachloride), $RuO_4$ (ruthenium tetroxide), and $(CH_3)_3Al$ (trimethylaluminum) may be used.

Figure 4E:
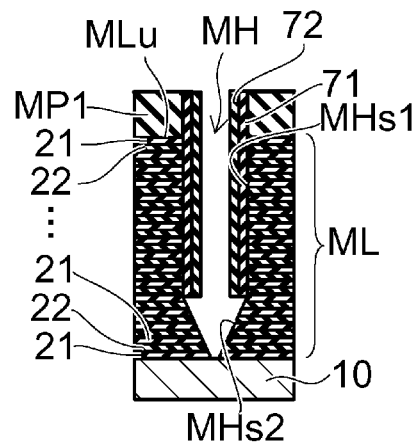

As illustrated in FIG. 4E, the first film 71 formed on the upper surface MLu of the workpiece ML, and the second film 72 formed on the surface of the first film 71 formed on the upper surface MLu of the workpiece ML are removed by using the first etchant (step S140). Thus, the portions of the first film 71 and the second film 72 formed on the upper surface MLu of the workpiece ML are removed using the first etchant. At this time, at least part of the first film 71 formed on the first side wall MHs1 (shallow portion) of the hole MH, and at least part of the second film 72 formed on the surface of the first film 71 (the first film 71 formed on the first side wall MHs1) remain. Thus, the portions of the first film 71 and the second film 72 formed on the first side wall MHs1 of the hole MH remain.

For example, an etching rate of the first film 71 by the first etchant is higher than an etching rate of the second film 72 by the first etchant. Thus, the first etchant is selective for the first film 71, which is selectively etched by the first etchant. For example, the first etchant is at least one of active species (for example, oxygen ions and oxygen radicals) included in oxygen plasma, and active species (for example, hydrogen ions and hydrogen radicals) included in hydrogen plasma.

Etching the first film 71 using the first etchant removes the second film 72 by a lift-off effect. On the upper surface MLu of the workpiece ML, the first film 71 having the high etching rate is formed beneath the second film 72 having the low etching rate. When there is a thin portion locally on the second film 72, the first film 71 is excessively etched through this portion. Accordingly, the second film 72 formed on the first film 71 is removed due to the lift-off effect as the first film 71 beneath, which provides adhesion for the second film 72 to the upper surface MLu, is removed. On this account, the first film 71 and the second film 72 on the upper surface MLu of the workpiece ML are favorably removed. A metal-containing film which is formed on an organic film at room temperature using an etching chamber is not dense in comparison to a CVD film of high temperature, and can be subject to lift-off since the etchant can contact the organic film through the low density meal-containing film. However, when it is necessary to actively reduce the thickness of the film, a second embodiment, which will be described later, may be used. In contrast, the first etchant does not rapidly etch the films inside the hole MH. Though the second film 72 on the shallow portion of the hole MH is thinner or low density, removal of the first film 71 and the second film 72 is by lift-off is much slower than that of the upper surface MLu. That is, portions of the first and second films 71 and 72 remain on the shallow portion in the hole MH after etching with the first etchant. Thus, etching of the first and second films 71 and 72 is also selective to the upper surface MLu.

Etching of the first film 71 and the second film 72 is performed as follows.

Figure 4F:
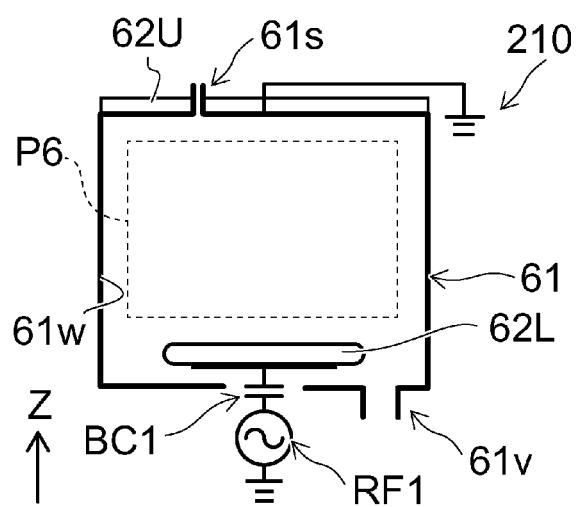

As illustrated in FIG. 4F, an oxygen gas is introduced into the chamber 61 from the gas supply port 61s, for example. Power is supplied to the stage 62L from the first power source RF1. Accordingly, sixth plasma P6 (oxygen containing plasma) is generated. Pressure in the chamber 61 is appropriately controlled. The first film 71 formed on the workpiece ML and the second film 72 formed on the first film 71 are irradiated with active species (for example, oxygen ions and radicals) included in the sixth plasma P6. For example, the pressure in the chamber 61 is equal to or larger than 10 mTorr and equal to or less than 1 Torr. The pressure in the chamber 61 is controlled by adjusting an amount of gas discharged from the chamber 61 through the exit port 61v.

The first film 71 and the second film 72 formed on the upper surface MLu of the workpiece ML are selectively etched by active species (first etchant) of the sixth plasma P6. As described above, due to the lift-off effect, the second film 72 formed on the surface of the first film 71 is removed as the first film 71 is etched. At this time, the first film 71 formed on the inner wall 61w of the chamber 61 and the second film 72 formed on the surface of the first film 71 are also partially removed. However, as described above, portions of the first film 71 and the second film 72 also remain on the shallow portion in the hole MH. This etching may be performed using hydrogen plasma.

Figure 4G:
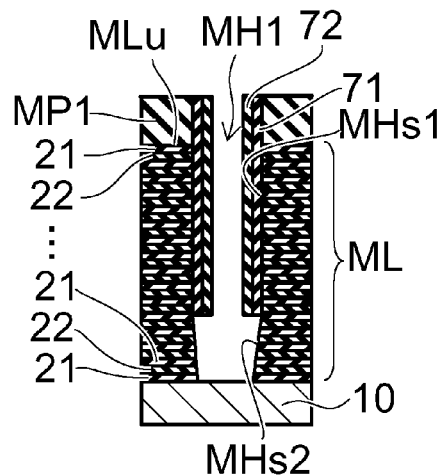

As illustrated in FIG. 4G, a part of the workpiece ML which is exposed in the hole MH is removed by using the second etchant (step S150). The second etchant includes fluorine and carbon.

An etching rate of the second etchant for the material of the workpiece ML is higher than an etching rate of the second etchant for the second film 72. Thus, the second etchant is selective to the material of the workpiece ML, which is selectively etched by the second etchant. By this etching, a part of the second side wall MHs2 (deep portion) of the hole MH is removed and the diameter of the deep portion increases. For example, the angle between the second side wall MHs2 of the hole MH and the Z direction after step S150 is smaller than the angle before step S150. That is, by step S150, the angle between the second side wall MHs2 (deep portion) and the Z direction is closer to the angle between the first side wall MHs1 (shallow portion) and the Z direction. The diameter of the hole MH becomes uniform. The hole which has a uniformly high aspect ratio can be formed.

The process using the second etchant as described above is performed as follows, for example.

Figure 4H:
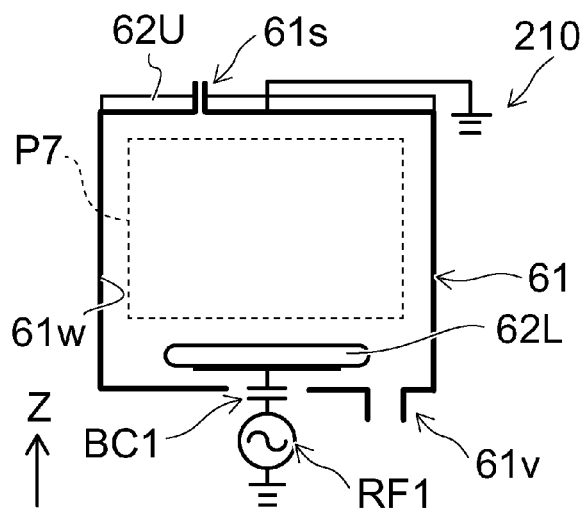

For example, as illustrated in FIG. 4H, a fluorocarbon based etching gas is introduced into the chamber 61 from the gas supply port 61s. Power is supplied to the stage 62L from the first power source RF1. Accordingly, seventh plasma P7 (fluorocarbon plasma) is generated in the chamber 61. A part of the workpiece ML which is exposed in the hole MH is removed by active species (second etchant) included in the seventh plasma P7.

In the embodiment described above, the first film 71 and the second film 72 are formed on the first side wall MHs1 (shallow portion) of the hole MH. Thereafter, the second side wall MHs2 (deep portion) of the hole MH is etched. Accordingly, the hole which is of the high aspect ratio and is uniform can be formed. The first side wall MHs1 (shallow portion) of the hole MH is covered by the first film 71 and the second film 72. On this account, bowing (a phenomenon in which the diameter of the hole MH is partially enlarged) is suppressed. By suppressing the bowing, device characteristic fluctuation in the semiconductor device can be reduced, for example.

For example, in step S140 (the step of removing the first film 71 and the second film 72 on the workpiece ML by using the first etchant), when the removal of the first film 71 and the second film 72 from the upper surface MLu of the workpiece ML is insufficient, and a part of these films remains on the upper surface MLu, the process in subsequent step S150 (the step of removing the side wall MHs2 on the deep portion of the hole MH by using the second etchant) is unstable. It is believed that the films unevenly remaining on the upper surface MLu (the first film 71 and the second film 72) may react with the active species of the second etching plasma, thereby changing the state of the plasma and thus affecting the etching characteristic in the deep portion of the hole MH. In addition, when a film (for example, the first film 71 and the second film 72) remains on the inner wall 61w of the chamber 61, and the film is peeled off, dusts may be generated. The hole becomes non-uniform due to the dusts, and the yield of a product is reduced.

In contrast, in step S140 before step S150 (step of etching the lower portion of the hole MH) according to the embodiment, the first film 71 and the second film 72 formed on the workpiece ML are effectively removed from the upper surface MLu. In addition, any material of the films 71 and 72 on the walls of the chamber 61 is also removed during processing by the first etchant. Accordingly, step S150 (the step of etching the lower portion of the hole MH) is uniformly and stably performed. In addition, the dusts are suppressed.

In the embodiment described above, the first film 71 and the second film 72 are formed on the inner wall 61w of the chamber 61. Since the first film 71 having the high etching rate is formed beneath the second film 72 having the low etching rate, it is easy to remove these films from the inner wall 61w of the chamber 61 due to the lift-off effect. The generation of dusts in the chamber 61 is suppressed. Accordingly, the yield of the manufacturing process of the semiconductor device is improved, for example.

Second Embodiment

In the second embodiment, a plurality of power sources are installed in a processing apparatus and power of different frequencies is supplied from the plurality of power sources.

FIGS. 5A to 5H are schematic views illustrating an example of a method for manufacturing a semiconductor device according to another embodiment.

FIGS. 5A, 5C, 5E, and 5G are cross section views illustrating a processing sequence exemplifying a method for manufacturing the semiconductor device. FIGS. 5B, 5D, 5F, and 5H illustrate a chamber in the processes illustrated in FIGS. 5A, 5C, 5E, and 5G.

Figure 5A:
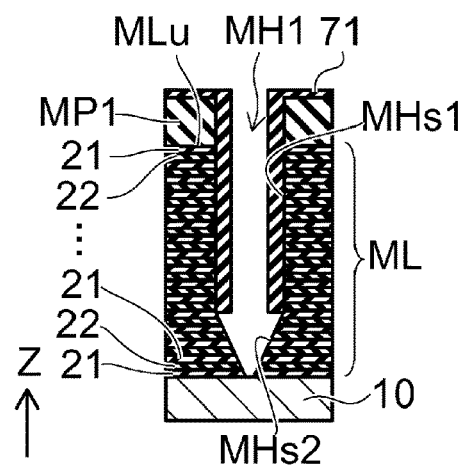
FIGS. 5A to 5H are schematic views illustrating an example of a method for manufacturing a semiconductor device according to a second embodiment.

As illustrated in FIG. 5A, after a hole MH is formed in a workpiece ML (step S110), a first film 71 is formed on the workpiece ML and a first side wall MHs1 (shallow portion) of the hole MH (step S120). The first film 71 may include carbon or may be a carbon film, for example.

Figure 5B:
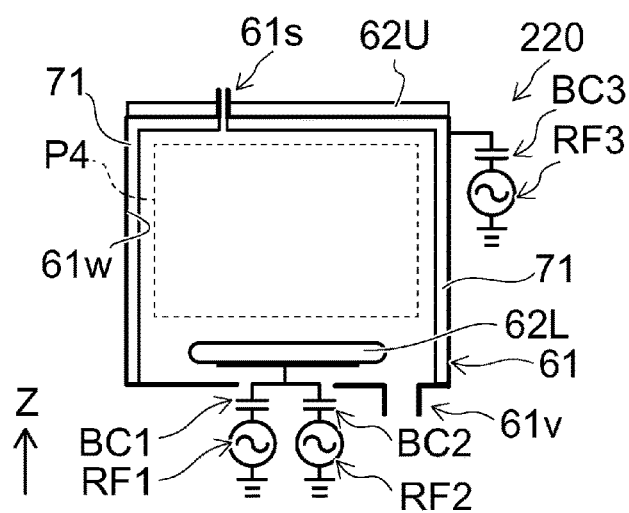

This process is performed by a processing apparatus 220 illustrated in FIG. 5B. The processing apparatus 220 further includes a second power source RF2 and a third power source RF3, in addition to the configuration of the processing apparatus 210 (see FIG. 2). These power sources are high frequency power sources such as RF sources, for example. The second power source RF2 is electrically connected with the stage 62L via a second blocking capacitor BC2. The third power source RF3 is electrically connected with the electrode 62U via a third blocking capacitor BC3. The other components are the same as those of the above-described processing apparatus 210.

In the embodiment of step S120 (the step of forming the first film 71), for example, a gas including methane is introduced into the chamber 61 from the gas supply port 61s. First power is supplied to the stage 62L from the first power source RF1. In this example, the second and third power sources RF2 and RF3 are not operated. A second frequency of second power is different from a first frequency of the first power. In this example, the first frequency is about 100 MHz. The second frequency is about 13.56 MHz, and the second frequency is lower than the first frequency. Fourth plasma P4 is generated in the chamber 61 by the first power from the first power source RF1. The first film 71 is formed by the fourth plasma P4 on the inner wall 61w of the chamber 61, the upper surface MLu of the workpiece ML (on the first mask pattern MP1 in this example), and the first side wall MHs1 (shallow portion) of the hole MH.

Figure 5C:
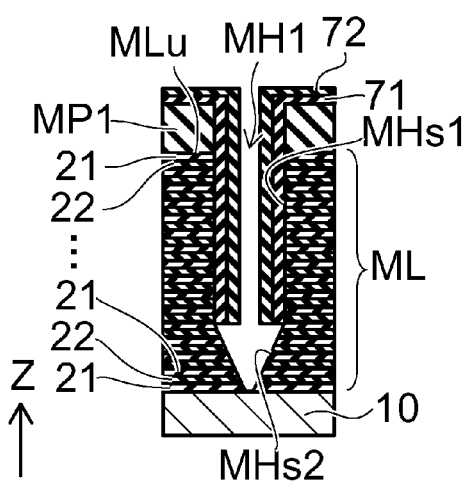

As illustrated in FIG. 5C, a second film 72 is formed on the surface of the first film 71 (step S130).

Figure 5D:
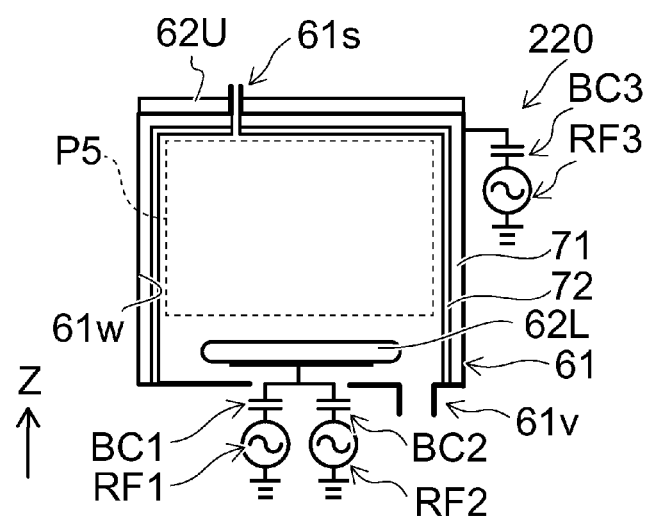

As illustrated in FIG. 5D, a gas including a metallic element (for example, tungsten hexafluoride or the like), and an oxygen gas are introduced into the chamber 61 from the gas supply port 61s. Power is supplied to the stage 62L from the first power source RF1 and the second power source RF2.

For example, third power and fourth power are supplied to the stage 62L from the first power source RF1 and the second power source RF2, respectively. A third frequency of the third power is different from a fourth frequency of the fourth power. For example, the fourth frequency is lower than the third frequency. In addition, fifth power is supplied to the electrode 62U from the third power source RF3. A fifth frequency of the fifth power is lower than at least one of the third frequency and the fourth frequency. The third frequency is about 100 MHz. Each of the fourth frequency and the fifth frequency is about 13.56 MHz, for example.

Fifth plasma (mixture gas plasma) is generated by the third power. The second film 72 is formed from the fifth plasma P5. At this time, the second film 72 formed on the surface of the first film 71 on the upper surface MLu of the workpiece ML is sputtered by operation of the fourth power, and thus becomes thinner.

In addition, the second film 72 on the first film 71 formed on the inner wall 61w of the chamber 61 is sputtered by the fifth power, and thus becomes thinner. The thickness of the second film 72 formed on the inner wall 61w of the chamber 61 becomes thinner than the thickness of the second film 72 formed on the first side wall MHs1 (shallow portion) of the hole MH.

Figure 5E:
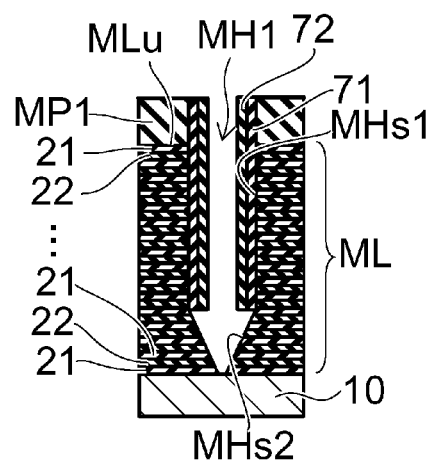

As illustrated in FIG. 5E, the first film 71 formed on the upper surface MLu of the workpiece ML, and the second film 72 formed on the surface of the first film 71 are removed by using the first etchant (step S140). An etching rate of the first etchant for the first film 71 is higher than an etching rate of the first etchant for the second film 72.

Figure 5F:
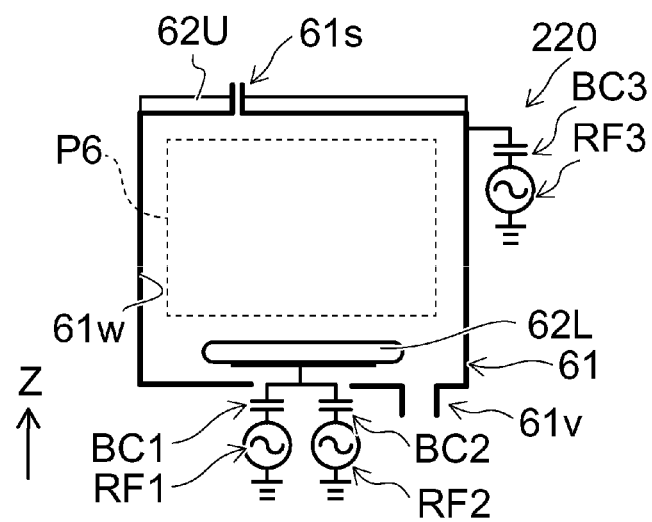

For example, as illustrated in FIG. 5F, an oxygen gas is introduced into the chamber 61 from the gas supply port 61s. Sixth power and seventh power are supplied to the stage 62L from the first power source RF1 and the second power source RF2, respectively. In addition, eighth power is supplied to the electrode 62U from the third power source RF3. A sixth frequency of the sixth power is different from a seventh frequency of the seventh power. For example, the seventh frequency is lower than the sixth frequency. An eighth frequency of the eighth power is lower than at least one of the sixth frequency and the seventh frequency. For example, the eighth frequency may be the same as any one of the sixth frequency and the seventh frequency. For example, the sixth frequency is about 100 MHz. The seventh frequency is about 13.56 MHz. The eighth frequency is about 13.56 MHz.

Sixth plasma P6 is generated by the sixth power. Accordingly, etching is performed. In addition, efficiency of removing the first film 71 formed on the upper surface MLu of the workpiece ML and the second film 72 formed on the surface of the first film 71 is improved by using the seventh power. In addition, efficiency of removing the first film 71 formed on the inner wall 61w of the chamber 61, and the second film 72 formed on the surface of the first film 71 is improved by using the eighth power. Accordingly, while these films are efficiently removed, the first film 71 and the second film 72 remain on the first side wall MHs1 (shallow portion) of the hole MH.

Figure 5G:
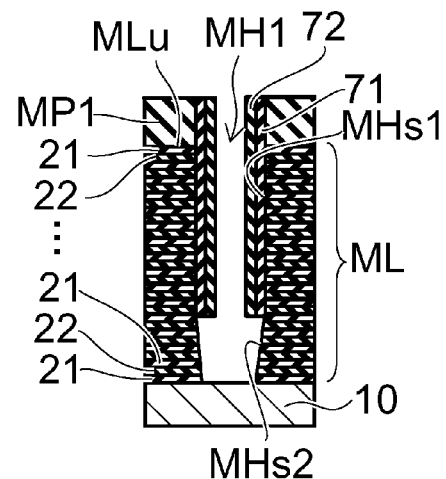

As illustrated in FIG. 5G, a part of the workpiece ML which is exposed in the hole MH is removed by using the second etchant (step S150). An etching rate of the second etchant for the workpiece ML is higher than an etching rate of the second etchant for the second film 72. Apart of the second side wall MHs2 (deep portion) of the hole MH is removed by this etching.

Above-described step 150 is performed as follows.

Figure 5H:
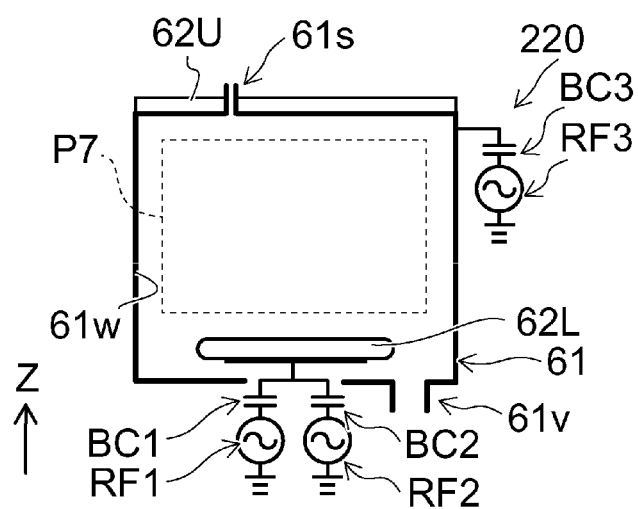

As illustrated in FIG. 5H, for example, a fluorocarbon based etching gas is introduced into the chamber 61 from the gas supply port 61s, and power is supplied to the stage 62L from the first power source RF1. Accordingly, the seventh plasma P7 (fluorocarbon plasma) is generated in the chamber 61. A part of the workpiece ML which is exposed from the first film 71 and the second film 72 in the hole MH is removed by active species (second etchant) included in the seventh plasma P7. A part of the second side wall MHs2 (deep portion) of the hole MH is removed, and the hole diameter of this portion is enlarged. The diameter of the hole MH becomes uniform. The hole which has a uniformly high aspect ratio can be formed (see FIG. 5G).

In the embodiment, the first film 71 and the second film 72 are formed on the first side wall MHs1 (shallow portion) of the hole MH. Thereafter, a part of the second side wall MHs2 (deep portion) of the hole MH is etched. Accordingly, the hole MH which has the uniformly high aspect ratio can be formed. For example, bowing can be suppressed. A semiconductor device having small device characteristic fluctuation can be manufactured.

In the second embodiment, the second film 72 is formed by supplying power from the second power source RF2 in addition to the power from the first power source RF1. The thickness of the second film 72 formed on the upper surface MLu of the workpiece ML can be reduced because the second film 72 is denser when formed in this manner. These films formed on the upper surface MLu of the workpiece ML can still be removed by subsequent etching, as described above.

In addition, in forming the second film 72, power is supplied to the electrode 62U from the third power source RF3. Accordingly, the thickness of the second film 72 formed on the inner wall 61w of the chamber 61 can be reduced because the second film 72 is denser. The first film 71 and the second film 72 formed on the inner wall 61w of the chamber 61 can still be removed by subsequent etching, as described above.

An example of a semiconductor device manufactured by the manufacturing method according to the embodiments will be described.

Figure 6A:
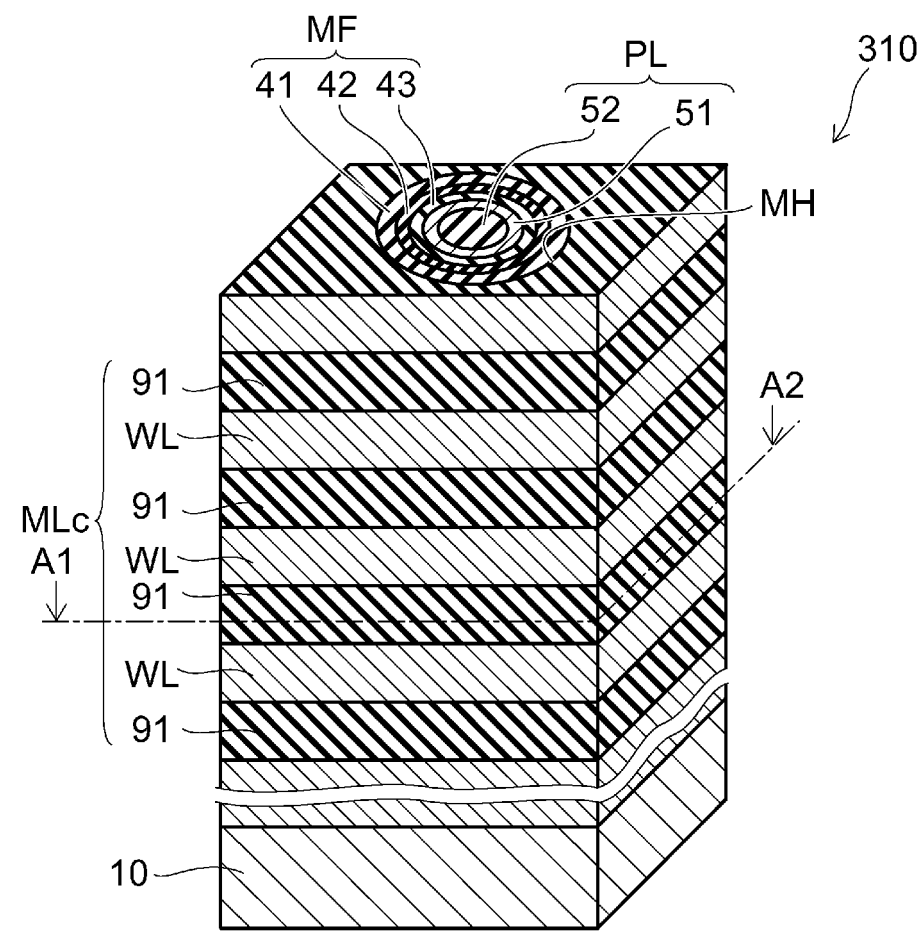
FIGS. 6A and 6B are schematic views illustrating an example of a semiconductor device.
Figure 6B:
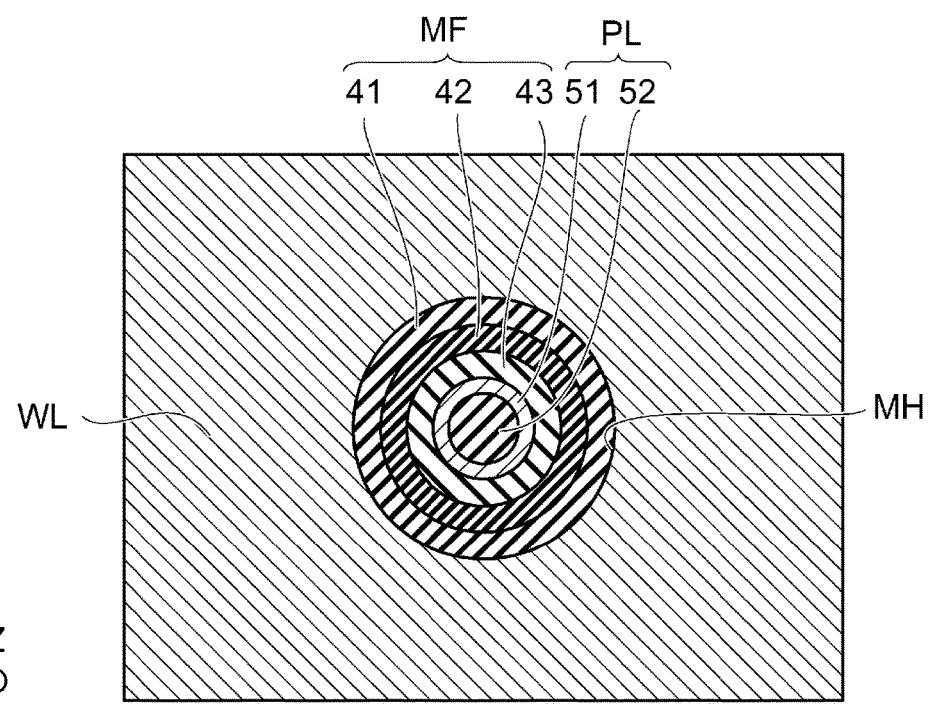

FIGS. 6A and 6B are schematic views illustrating an example of a semiconductor device. FIG. 6A is a schematic perspective view. FIG. 6B is a cross section view taken along line A1-A2 of FIG. 6A.

As illustrated in FIG. 6A, a semiconductor device 310 includes a base body 10, a stacked body MLe, and a pillar PL. The base body 10 may include a semiconductor substrate, for example. The base body 10 may include an insulating film formed on the semiconductor substrate. The stacked body MLe is formed on the base body 10. The stacked body MLe includes a plurality of interlayer insulating layers 91 and a plurality of conductive layers WL. For example, the interlayer insulating layer 91 corresponds to the first layer 21 (see FIG. 4A). For example, the conductive layer WL is formed by forming a conductive material in a space after removing the second layer 22 after processing in above-described steps S110-S150. The pillar PL extends through the core of the stacked body MLe in the first direction.

The pillar PL includes a semiconductor film 51 and a core insulating film 52. The core insulating film 52 extends through the core of the stacked body MLe in the Z direction. The semiconductor film 51 is formed between the stacked body MLe and the core insulating film 52.

A memory film MF is formed between the pillar PL and the stacked body MLe. The memory film MF includes a block insulating layer 41, a charge storage layer 42, and a tunnel insulating layer 43.

The block insulating layer 41 is formed between the pillar PL and the stacked body MLe. The tunnel insulating layer 43 is formed between the pillar PL and the block insulating layer 41. The charge storage layer 42 is formed between the block insulating layer 41 and the tunnel insulating layer 43. The pillar PL and the memory film MF are formed in the hole MH.

As illustrated in FIG. 6B, a memory cell is formed between the conductive layer WL and the pillar PL of the semiconductor device 310. Memory cells are formed between the plurality of conductive layers WL and the pillar PL in the semiconductor device 310. When a bowing part is formed in the hole MH, the shape of the memory cell is irregular and device characteristic fluctuates.

In a reference example in which the first film and the second film are not formed in the hole MH, when the lower portion of the hole MH is etched, active species such as ions rebound from a facet part formed at the lower portion of the hole MH. The rebounded active species collide with the side wall of the hole MH, and bowing is easily generated.

In an embodiment, the side wall of the hole MH is protected by the first film 71 and the second film 72. Accordingly, the occurrence of bowing is suppressed. In addition, the films formed on the workpiece can be effectively removed in a state where the first film and the second film of the shallow portion of the side wall of the hole remain, by appropriately setting the etching rates of the first film and the second film. In addition, the shallow portion of the hole is protected by using the remaining films, and the deep portion of the hole is enlarged. For example, a deep hole with a diameter of high uniformity can be formed. In addition, a hole which has uniformly high aspect ratio can be formed.

According to the embodiments, a method for manufacturing a semiconductor device, which can form a hole which has a uniformly high aspect ratio, can be provided.

Exemplary embodiments have been described with reference to the specific examples. However, the present invention is not limited to the above-described specific examples. For example, a combination of two or more components described in each specific example, which falls within a technically applicable range, is included in the scope of the present invention including the overview of the present invention.

In addition, a person skilled in the art could derive various change examples and modification examples within the scope of the idea of the present invention, and it should be understood that those change examples and modification examples belong to the scope of the present invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, the method comprising:
    forming a hole extending in a first direction in a workpiece, the workpiece including a first layer of a first material, a second layer of a second material stacked on the first layer in the first direction, a third layer of the first material stacked on the second layer in the first direction, and a fourth layer of the second material stacked on the third layer in the first direction;
    forming a first film on an upper surface of the workpiece and an upper portion of a side wall of the hole;
    forming a second film on a surface of the first film;
    selectively removing the first film and the second film at the same time from the upper surface of the workpiece using a first etchant so that at least a part of the first film formed on the upper portion and at least a part of the second film formed on the surface of the first film remain; and
    removing at least a part of a portion of the workpiece which is exposed through the hole using a second etchant,
    wherein an etching rate of the first film by the first etchant is higher than an etching rate of the second film by the first etchant.

2. The method according to claim 1, wherein the first layer includes a silicon oxide, and the second layer includes a silicon nitride.

3. The method according to claim 1, wherein the first film is formed using a gas including hydrocarbon.

4. The method according to claim 1, wherein the first film includes a carbon film, and the second film includes a metal oxide film.

5. The method according to claim 4, wherein a metallic element included in the metal oxide film includes at least one element selected from the group consisting of tungsten, molybdenum, titanium, aluminum, rhenium, iridium, platinum, and ruthenium.

6. The method according to claim 5, wherein the forming of the second film is performed in a chamber in which the forming of the first film is performed.

7. The method according to claim 6, wherein the selectively removing using the first etchant is performed in the chamber.

8. The method according to claim 7, wherein
    in the forming of the first film, a part of the first film is formed on at least part of an inner wall of the chamber, and
    in the forming of the second film, a part of the second film is formed on at least part of the first film formed on the inner wall of the chamber.

9. The method according to claim 8, wherein the removing using the first etchant includes:
    removing at least a part of the first film formed on the inner wall of the chamber, and at least a part of the second film formed on the first film on the inner wall of the chamber.

10. The method according to claim 9, wherein the removing using the second etchant is performed in the chamber.

11. The method according to claim 10, wherein the forming of the hole is performed in the chamber.

12. The method according to claim 11, wherein
    the forming of the first film includes supplying first power from a first power source to a stage where the workpiece is placed,
    the forming of the second film includes supplying third power from the first power source and fourth power from a second power source to the stage, and supplying fifth power from a third power source to an electrode,
    the workpiece is placed between the stage and the electrode,
    a third frequency of the third power is different from a fourth frequency of the fourth power, and
    a fifth frequency of the fifth power is lower than any one of the third frequency and the fourth frequency.

13. The method according to claim 12, wherein the fifth frequency is the same as any one of the third frequency and the fourth frequency.

14. The method according to claim 13, wherein the removing using the first etchant includes:
    supplying sixth power from the first power source and seventh power from the second power source to the stage, and
    supplying eighth power from the third power source to the electrode, wherein
    a sixth frequency of the sixth power is different from a seventh frequency of the seventh power, and
    an eighth frequency of the eighth power is lower than any one of the sixth frequency and the seventh frequency.

15. The method according to claim 14, wherein the eighth frequency is the same as any one of the sixth frequency and the seventh frequency.

16. The method according to claim 15, wherein the eighth frequency is the same as any one of the third frequency and the fourth frequency.

17. The method according to claim 16, wherein the first etchant includes at least one of an oxygen ion and a hydrogen ion.

18. The method according to claim 17, wherein the second etchant includes fluorine and carbon.

19. The method according to claim 1, wherein the selectively removing the first film and the second film at the same time comprises etching the first film with the first etchant and removing the second film by a lift-off effect.

20. A method for manufacturing a semiconductor device, the method comprising:
forming a hole extending in a first direction in a workpiece, the workpiece including a first layer of a first material, a second layer of a second material stacked on the first layer in the first direction, a third layer of the first material stacked on the second layer in the first direction, and a fourth layer of the second material stacked on the third layer in the first direction;
forming a first film on an upper surface of the workpiece and an upper portion of a side wall of the hole, wherein the first film is formed using a gas including methane;
forming a second film on a surface of the first film;
selectively removing the first film and the second film from the upper surface of the workpiece using a first etchant so that at least a part of the first film formed on the upper portion and at least a part of the second film formed on the surface of the first film remain; and
removing at least a part of a portion of the workpiece which is exposed through the hole using a second etchant,
wherein an etching rate of the first film by the first etchant is higher than an etching rate of the second film by the first etchant.

21. A method for manufacturing a semiconductor device, the method comprising:
forming a hole extending in a first direction in a workpiece, the workpiece including a first layer of a first material, a second layer of a second material stacked on the first layer in the first direction, a third layer of the first material stacked on the second layer in the first direction, and a fourth layer of the second material stacked on the third layer in the first direction;
forming a first film on an upper surface of the workpiece and an upper portion of a side wall of the hole;
forming a second film on a surface of the first film, wherein the forming of the second film includes:
forming the second film using a gas including at least one selected from the group consisting of tungsten hexafluoride, molybdenum hexafluoride, rhenium hexafluoride, iridium hexafluoride, platinum hexafluoride, titanium tetrachloride, ruthenium tetroxide, and trimethylaluminum, and an oxygen gas;
selectively removing the first film and the second film from the upper surface of the workpiece using a first etchant so that at least a part of the first film formed on the upper portion and at least a part of the second film formed on the surface of the first film remain; and
removing at least a part of a portion of the workpiece which is exposed through the hole using a second etchant,
wherein an etching rate of the first film by the first etchant is higher than an etching rate of the second film by the first etchant.

* * * * *